United States Patent
Jacob et al.

(10) Patent No.: US 9,391,231 B2
(45) Date of Patent: Jul. 12, 2016

(54) METHOD FOR PREPARING A THIN LAYER OF AN ABSORBER MADE OF COPPER, ZINC AND TIN SULFIDE(S), ANNEALED THIN LAYER AND PHOTOVOLTAIC DEVICE THUS OBTAINED

(71) Applicant: IMRA EUROPE SAS, Valbonne (FR)

(72) Inventors: Alain Jacob, Antibes (FR); Gerardo Larramona, Valbonne (FR); Stephane Bourdais, Antibes (FR); Christophe Chone, La Colle sur Loup (FR); Yan Cuccaro, Antibes (FR)

(73) Assignee: IMRA EUROPE SAS, Valbonne (FR)

( * ) Notice: Subject to any disclaimer, the term of this patent is extended or adjusted under 35 U.S.C. 154(b) by 0 days.

(21) Appl. No.: 14/758,314

(22) PCT Filed: Nov. 26, 2013

(86) PCT No.: PCT/FR2013/052851
§ 371 (c)(1),
(2) Date: Jun. 29, 2015

(87) PCT Pub. No.: WO2014/118444
PCT Pub. Date: Aug. 7, 2014

(65) Prior Publication Data
US 2015/0333212 A1    Nov. 19, 2015

(30) Foreign Application Priority Data
Jan. 29, 2013    (FR) ...................................... 13 50741

(51) Int. Cl.
| | | |
|---|---|---|
| *H01L 31/00* | (2006.01) | |
| *H01L 31/18* | (2006.01) | |
| *H01L 31/0445* | (2014.01) | |
| *H01L 31/0224* | (2006.01) | |
| *H01L 21/02* | (2006.01) | |
| *H01L 31/032* | (2006.01) | |
| *H01L 31/0392* | (2006.01) | |

(52) U.S. Cl.
CPC ...... *H01L 31/1864* (2013.01); *H01L 21/02491* (2013.01); *H01L 21/02557* (2013.01);
(Continued)

(58) Field of Classification Search
None
See application file for complete search history.

(56) References Cited

U.S. PATENT DOCUMENTS

| | | | | |
|---|---|---|---|---|
| 2011/0094557 A1* | 4/2011 | Mitzi | .................. | H01L 21/0237 136/244 |
| 2012/0220066 A1* | 8/2012 | Cao | .................. | H01L 21/02568 438/73 |

(Continued)

FOREIGN PATENT DOCUMENTS

| | | |
|---|---|---|
| WO | 2012071287 A1 | 5/2012 |
| WO | 2012071288 A1 | 5/2012 |
| WO | 2012071289 A2 | 5/2012 |

OTHER PUBLICATIONS

International Search Report mailed Feb. 3, 2014, corresponding to International Patent Application PCT/FR2013/052851.
(Continued)

*Primary Examiner* — Robert Vetere
(74) *Attorney, Agent, or Firm* — Ladas & Parry LLP

(57) ABSTRACT

The present invention provides a thin compact crystallized layer with large grains of an absorber material essentially consisting of Cu, Zn and Sn sulphide(s), preferably CZTS, with less defects and preferably with improved composition homogeneity and/or reduced content of secondary phases, by producing a method for double annealing, in determined atmospheres, of thin layers of particles of a so-called absorber material based on copper, zinc and tin sulphide, preferably on CZTS, deposited on a substrate covered with molybdenum (Mo), said thin annealed absorber layer deposited on said Mo substrate imparting improved photovoltaic performances to a photovoltaic device which comprises them.

19 Claims, 3 Drawing Sheets

Figure 1A:
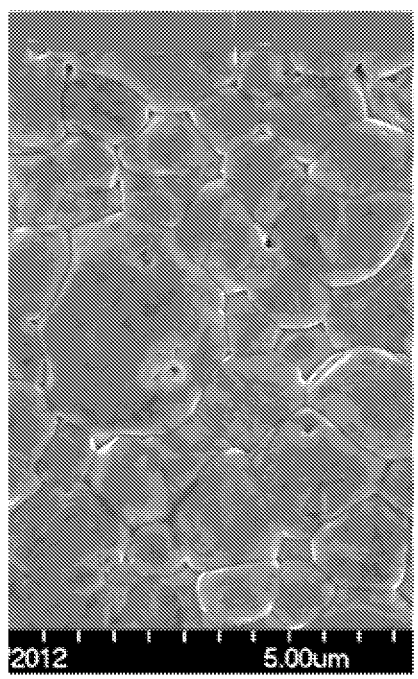

(52) U.S. Cl.
CPC .... *H01L21/02568* (2013.01); *H01L 21/02601* (2013.01); *H01L 21/02628* (2013.01); *H01L 31/022425* (2013.01); *H01L 31/022483* (2013.01); *H01L 31/0326* (2013.01); *H01L 31/03923* (2013.01); *H01L 31/0445* (2014.12); *Y02E 10/541* (2013.01)

(56) References Cited

U.S. PATENT DOCUMENTS

| | | | |
|---|---|---|---|
| 2014/0048137 A1* | 2/2014 | Cao | C09D 11/52 136/264 |
| 2014/0182665 A1* | 7/2014 | Liang | H01L 31/0749 136/252 |

OTHER PUBLICATIONS

Tanaka et al.: "Preparation of Cu2ZnSnS4 thin films by sulfurizing sol-gel deposited precursors", Solar Energy Materials and Solar Cells, Elsevier Science Publishers, Amsterdam, NL, vol. 91, No. 13, Jun. 5, 2007, pp. 1199-1201.

Ankur Khare: "Synthesis and Characterization of Copper Zinc Tin Sulfide Nanoparticles and Thin Films", Jun. 30, 2012, Retrieved from the Internet: URL:http://conservancy.umn.edu/bitstream/133748/1/Khare_umn_0130E_12926.pdf.

Kazuya Maeda et al: "Influence of H2S concentration on the properties of Cu2ZnSnS4 thin films and solar cells prepared by sol gel sulfurization", Solar Energy Materials and Solar Cells, Elsevier Science Publishers, Amsterdam, NL, vol. 95, No. 10, May 31, 2011, pp. 2855-2860.

* cited by examiner

METHOD FOR PREPARING A THIN LAYER OF AN ABSORBER MADE OF COPPER, ZINC AND TIN SULFIDE(S), ANNEALED THIN LAYER AND PHOTOVOLTAIC DEVICE THUS OBTAINED

This application is a 371 of PCT/FR2013/052851, filed on Nov. 26, 2013, which claims priority to French Application No. 1350741, filed Jan. 29, 2013.

The present invention relates to a method for manufacturing a film or thin layer of copper, zinc and tin metal sulphide(s) crystallized with large grains, deposited on a substrate. More particularly, the present invention relates to a solid photovoltaic device comprising a so-called metal layer of sulphide(s) as an absorption layer.

The present invention more particularly further relates to:
- a method for annealing a thin layer of an absorbing material based on copper, zinc and tin sulphide(s), preferably containing in majority a quaternary compound Cu—Zn—Sn—S (i.e. $Cu_2ZnSnS_4$ known as CZTS also-called kesterite), deposited on a substrate covered with molybdenum (designated hereafter by « Mo substrate »),
- a thin layer CZTS on an annealed thereby obtained Mo substrate, and
- a photovoltaic device of the type comprising a so-called substrate covered with a so-called annealed thin absorption layer.

Commercial photovoltaic devices are of the silicon (Si) type, or of the thin absorber layer based on CdTe or $CuGa_x\text{-}In_ySe_2$ (designated as CIGS). The main application of these photovoltaic devices is as a domestic photovoltaic generator on the roofs of houses. The typical rated power of these devices is of the order of 1-5 kilowatts (at the maximum power point), for a panel surface of the order of 10 to 20 $m^2$ which represents a rated photovoltaic yield typically of the order of 10-15%. The main problem of the devices of the Si type is their manufacturing cost and their energy balance. The main problem of the devices based on CdTe and CIGS is that they use certain compounds with a toxic nature (such as those made on the basis of Cd, Se or Te) or they use certain not very abundant elements (such as indium, In).

Recently, a novel photovoltaic device of the thin layer type has been proposed based on copper (Cu), zinc (Zn) and tin (Sn) sulphide, Cu—Zn—Sn—S, commonly designated as CZTS, as a replacement for CIGS as an alternative using very abundant elements. The best reported photovoltaic yield is 8.4% (Shin et al. in Prog. Photovolt.: Res. Appl., 21, 72, 2011). An alternative of this device comprises a thin absorber layer based on copper, zinc and tin sulphide-selenide (called CZTSSe or CZTSe), for which the best reported yield is 11.1% (Todorov et al. Adv. Energy Mat. 2012).

The most widespread structure of a photovoltaic device based on the absorber material CZTS is that of the so-called substrate type and comprises different stacked flat layers, typically comprising at least:
- an optically transparent conductive layer, a so-called front contact layer, for example of the TCO (transparent conductive oxide) type, and
- an insulating and transparent compound layer, for example a layer of ZnO or $ZnMg_xO_{1-x}$, and
- a buffer layer of a semi-conductor of type n, for example CdS or $In_2S_3$ or Zn(S,O,OH), and
- a layer, a so-called absorption layer of type p, and
- a conductive material layer, a so-called rear contact layer, for example a metal layer of molybdenum (Mo), or gold (Au), graphite (C), nickel (Ni) or further aluminium (Al), silver (Ag) or indium (In).

In a solid photovoltaic device said to be of the substrate type, the layers above are completed with:
- a metal grid applied against said front contact layer thus forming the front face (sun side) of the device, and
- a glass or steel layer applied against said rear contact layer.

Solid photovoltaic devices with a structure of the substrate type are well known to one skilled in the art. For example they are described in the book « Thin film solar cells; manufacture, characterization and applications », edited by Jef Poortmans and Vladimir Arkhipov, Wiley 2007.

The present invention relates to a thin film of an absorber material based on copper, zinc and tin sulphide(s), preferably CZTS, notably with variable percentages around the stoichiometric compound $Cu_2ZnSnS_4$, deposited on a substrate covered with molybdenum.

The major difference between the different photovoltaic devices comprising an absorber layer CZTS lies in the method for manufacturing the actual CZTS layer.

CZTS thin layers have been deposited by different methods, using vacuum deposition techniques or atmospheric pressure deposition techniques, notably by using solutions or suspensions in liquids. In most of the techniques, one or several layers are deposited by using precursors like metals (Cu, Sn, Zn or alloys), mixtures of sulphides of a single metal ($Cu_2S$, CuS, ZnS, SnS, $SnS_2$), salts of dissolved metals (with or without a sulphur precursor), or combinations thereof. In other techniques, one starts with the CZTS material already formed, as colloidal dispersions, inks or slurries based on particles (of micrometric or nanometric size) of CZTS (for liquid deposits) or from compacted CZTS powder in a sintered tablet (for vacuum depositions). These techniques allow better control of the stoichiometry, during the step for manufacturing CZTS particles, with a lesser risk of the presence of secondary phases, since the starting material is the same as the final one.

The vacuum deposition methods have a higher manufacturing cost. Among the deposition methods with liquid solutions of precursors, the one using the solvent, hydrazine, gave the possibility of attaining a high photovoltaic yield, but the solvent used is highly toxic. Other methods applying liquid solutions of precursors use other solvents which are not or are not very toxic, and techniques such as « spin coating » or electro-deposition. However, they have disadvantages such as a long deposition time, the impossibility of applying a continuous industrial deposition method (« roll-to-roll »), or the difficulty of controlling the stoichiometry of the CZTS compound.

The deposition methods using colloidal dispersions or inks of particles of CZTS material, with techniques such as « spraying » or « tape casting », allow continuous deposition, which is preferable industrially in order to reduce the manufacturing time and to increase reproducibility.

The present invention relates to the deposition of the absorber layer with a deposition method from a colloidal dispersion as a liquid, deposited at atmospheric pressure, for example by spraying or by printing, or of a slurry for example deposited by tape casting, for manufacturing photovoltaic devices of the thin layer type based on the absorber material CZTS, by rapid deposition and at a low cost by using colloidal dispersions or slurries.

Various publications describe CZTS layers made with colloidal solutions, inks or slurries based on CZTS nanoparticles or microparticles. In certain publications, the colloidal solution or ink consists of a mixture of sulphides of one or two metals (like Cu—S, Zn—S, Sn—S, Cu—Sn—S) (Akhavan et al., J. Solid State Chem. 189, 2, 2012, Todorov et al., Thin Solid Films 517, 2541, 2009), (Wang et al., J. Alloys & Compounds 539, 237, 2012, and Zhou et al. Solar Energy Mat. & Solar Cells, 94, 2042, 2010). These articles report a morphology of the layers with small grains and/or pores, as well as low photovoltaic performance of the photovoltaic devices manufactured with these layers. This morphology may at least partly explain this poor performance.

Deposition of the CZTS layer is generally followed by annealing at a high temperature, notably around 500° C. A possible role of the annealing is to allow the precursors present in the layer to react so as to end up with the CZTS phase, in the cases when the latter is not yet formed at the end of the deposition. In certain cases, the annealing is carried out in an atmosphere which contains a sulphur precursor (S), because the layer of precursors is deficient in it, or because a loss of sulphur is observed under annealing without its presence. Another role of the annealing is to increase the size of the grains and possibly densify the layer, which are required properties for good photovoltaic performance (by reducing the possible recombinations of the charge carriers at the grain boundaries, or by avoiding the short-circuit between the portions of the non-covered Mo substrate (notably holes left in the CZTS layer) and the layers above the CZTS layer).

Various types of annealings are known from the state of the art. They mainly differ by the type of atmosphere under which annealing is carried out. Annealings under a neutral atmosphere (notably nitrogen or argon) at different pressures or in vacuo are notably known; they are suitable for layers which already have a sufficient S content. Annealings under an atmosphere containing a sulphur precursor, notably $H_2S$ gas (typically diluted in argon or nitrogen) or elementary S vapour (by heating the S powder placed in the same chamber of the annealing or in an annexed chamber) are also known; this type of annealing is notably used for layers of CZTS precursors which do not contain or are deficient in S; annealing alternatives under elementary Se or under $H_2Se$ are known for exchanging a portion of the S with Se, in order to thus reach an absorber composition of the CZTSSe type.

An annealing example in an $H_2S$ atmosphere is described in the article of Maeda et al. (Solar Energy Materials and Solar Cells, Elsevier Science Publishers, Amsterdam, Vol. 95 no. 10 pp 2855-2860—May 31, 2011), which relates to the preparation of thin layers of CZTS particles by the so-called «sol-gel» method in which the layer is deposited on a substrate by directly using precursors of salts of metals without using chalcogenide precursors notably without using sulphide or sulphur precursors. In this article, the layer deposited on the substrate is subject to a single annealing. The CSTZ layers obtained in this article have a morphology in which the large grains of particles are not placed side by side in contact with each other in order to form a compact layer but have many holes and large sizes. The properties of the CZTS layer obtained (see table 3 of this article) provide a low photovoltaic yield of not more than 2.23% and very low short circuit current intensity, «short circuit current» Jsc, i.e. less than or equal to 10 $mA/cm^2$, which represents values less than half of what is usually considered as required for a suitable CZTS absorption layer in a photovoltaic device.

Finally, annealings under an atmosphere containing SnS vapour, which may also contain S vapour, (by heating powders of these compounds in the same chamber or in an annex chamber to that of the annealing) are also known; this type of annealing is applied when formation of secondary phases such as SnS or loss of Sn are suspected. In one alternative, an atmosphere containing SnSe vapour is used in the case when a CZTSSe composition is targeted.

All these annealing methods are accomplished in a single step, under a same atmosphere.

The role of the annealing is specially important for depositions using colloidal dispersions (or inks or slurries) of particles, for which it proves to be difficult to densify the layer and to sufficiently increase the size of the grains.

Another problem during the manufacturing of the CZTS layers is the presence of defects in the actual CZTS grains, which may promote recombination of charge carriers, and therefore reduce the photovoltaic performance. In the state of the art, it is not known how to actually control the concentration in order to reduce this type of defect.

Another important problem during the manufacturing of CZTS layers is that of the undesirable presence of secondary crystalline phases, in particular binary and ternary phases of sulphides of only one or respectively two of the Cu, Zn and Sn metals, like Cu—S, Zn—S, Sn—S compounds or respectively Cu—Sn—S. In the case of depositions from colloidal dispersions comprising CZTS particles already formed, these secondary phases may appear because of decomposition reactions of the actual material or by interaction with the substrate during the annealing step at a high temperature. Some of these secondary phases are suspected to degrade the photovoltaic performance because they would promote recombination of charge carriers. One of these secondary phases is SnS, which may be formed during decomposition of CZTS into sulphides of a single metal ($Cu_2S$ plus ZnS plus $SnS_2$), followed by decomposition of $SnS_2$ into SnS.

Finally, other authors propose totally different CZTS layer structures, like in WO 012/071288 and WO 2012/071289, where CZTS layers, so-called «MGL» layers are described consisting of CZTS particles of micrometric sizes, defined on page 9 lines 25 to 29, which are embedded by an inorganic matrix. In the obtained layers, the large grains of CZTS particles are not directly in contact against each other, but they are surrounded by a so-called more or less amorphous matrix and the large grains of which are separated from each other. The role of the inorganic matrix is to ensure adherence of the large grains together and on the substrate. The obtained absorber layer is therefore not homogenous in crystallinity or in composition. The photovoltaic devices made with this layer have photovoltaic yields of less than 0.1%.

An object of the present invention is to provide a method for preparing a thin layer of an absorber material consisting essentially of Cu, Zn and Sn sulphide(s) with atomic percentages of the three metals Cu, Zn and Sn which may vary in the interval from x=40 to 60% for Cu and y=15 to 35% for Zn and z=15 to 35% for Sn, with x+y+z=100%, preferably a CZTS compound, from dispersions of Cu, Zn and Sn sulphide particles, preferably a CZTS particle dispersion, as a liquid, such as an ink, or as a slurry, in order to obtain a compact crystallized layer with large grains, placed side by side in direct contact with each other, with less defects and preferably improved homogeneity of the composition and/or not containing or few crystalline secondary phases, notably no or few crystalline binary or ternary phases of sulphides of one or respectively two metals selected from Cu, Zn and Sn.

Another object of the present invention is to provide photovoltaic devices of the type comprising a thin layer based on the CZTS absorber material, having improved photovoltaic performance, notably open circuit voltages of more than 0.45 V and short-circuit currents of more than 10 $mA/cm^2$ and a yield of more than 3%.

Here by:
  «CZTS» is meant here a compound consisting at least in majority, preferably essentially of Cu, Zn and Sn sulphide(s), as a quaternary compound Cu—Zn—Sn—S, with atomic percentages (i.e. the percentage of the number of atoms) of the three metals Cu, Zn and Sn which may vary in the interval from x=40 to 60% for Cu and y=15 to 35% for Zn and z=15 to 35% for Sn, with x+y+z=100%, the stoichiometric compound for which the atomic percentages Cu:Zn:Sn are 50:25:25 corresponding to the compound $Cu_2ZnSnS_4$, not necessarily being the best composition from the point of view of photovoltaic quality.

« absorber material consisting essentially of Cu, Zn and Sn sulphide(s) » is meant here that said material consists essentially of Cu, Zn and Sn and S, the compound may contain a small percentage of not more than 4% (atomic percentages) of impurities from other elements such as Na and Cl or others from the use of precursors of said particles of metal sulphides such as CZTS particles, in the preparation method and/or from the substrate and/or the chamber of the deposition or of the annealing in which the manufacturing was carried out;

« dispersion of particles as a liquid », is meant here a colloid containing a homogenous dispersion of nanoparticles, for which the dimensions range from 2 to 500 nm and which may contain additives for ensuring dispersion and promoting the deposition as an ink, such as surfactants, binders, surface blocking agents (« capping agents »), etc.; the stability of such a homogenous dispersion is due to the slowness of the separation of the two solid and respectively liquid phases.

« dispersion of particles as a slurry based on particles », is meant here a dispersion similar to a so-called liquid, but too viscous for flowing and which may contain nanoparticles or microparticles of larger sizes, notably up to 5 µm, preferably not more than 2 µm;

« amorphous particles », are meant particles which are not or not very crystallized, i.e. characterized by the absence of a well-defined diffraction peak measured by the x-ray diffraction technique (called XRD);

« thin layer » is meant a layer with a thickness from 0.5 to 5 µm, preferably from 0.5 to 3 µm;

« dense layer » or « compact layer », is meant a layer consisting of large grains placed side by side in direct contact with each other, at least on a portion of their external surface, and the covering level of the surface of the substrate by the CZTS deposit is more than 95%, more particularly more than 98%, and the layer of which has a porosity of less than 10%, ideally not having any apparent porosity;

« large grains », are meant particles with an average size greater than or equal to 500 nm, more particularly, an average size of the order of 1 µm or more, resulting from the growth of said nanoparticles during the heat treatment step;

« a layer with few or no crystalline secondary phases », is meant a layer for which the area of the main XRD peaks corresponding to said crystalline secondary phases is less than 1/50th of the area of the main peak of the quaternary CZTS crystalline phase by quantitative measurement with XRD (X-ray diffraction); and « homogeneous composition », is meant a layer not including any area for which the composition in an elementary atomic composition as ascertained by EDX mapping is clearly differentiated with respect to the average composition of the layer.

According to the present invention, it was discovered that it was possible to obtain a compact crystallized layer essentially consisting of large crystal grains, placed side by side in direct contact with each other, of said absorber material essentially consisting of Cu, Zn and Sn sulphide(s), preferably CZTS, with less defects or even an improved composition homogeneity and/or a reduced content of secondary phases, with notably no or few crystalline binary or ternary phases of sulphides of one or respectively two metals selected from Cu, Zn and Sn, by carrying out a method for double annealing, under determined atmospheres, of the thin layers of particles of said absorber material based on copper, zinc and tin sulphide, deposited on a substrate covered with molybdenum (Mo), said annealed thin absorber layer deposited on said substrate Mo imparting improved photovoltaic performances to a photovoltaic device comprising some of them in accordance with the object of the present invention, notably open circuit voltages of more than 0.45 V and short-circuit currents of more than 10 $mA/cm^2$ and a yield of more than 3%.

In particular, the thereby obtained absorber layers give improved photovoltaic performances to the absorber material deposited on a substrate.

More specifically, the present invention provides a method for manufacturing a thin layer of absorber material essentially consisting of Cu, Zn and Sn sulphide(s) with atomic percentages of the three metals Cu, Zn and Sn which may vary in the interval from x=40 to 60% for Cu and y=15 to 35% for Zn and z=15 to 35% for Sn, with x+y+z=100%, preferably as a quaternary Cu—Zn—Zn—S compound designated hereafter by CZTS compound with large crystalline grains of average sizes of at least 500 nm, said thin absorber layer being deposited on one (or more) materials in layer(s) forming a substrate, in which the following successive steps are carried out:

1) A layer is deposited by means of a dispersion of particles, as a liquid or a slurry, said particles being nanoparticles of Cu, Zn and Sn sulphide(s) with sizes of less than 500 nm, preferably CZTS particles, on a molybdenum layer (Mo) of a said substrate covered with molybdenum a layer (Mo), and 2) An annealing heat treatment of said layer deposited on said substrate is carried out at a maximum temperature of at least 300° C., preferably at least 450° C., in order to obtain crystallization and a growth of the particles in order to obtain large crystalline grains with average sizes of at least 500 nm, over a thickness from 0.5 to 5 µm, preferably from 0.5 to 3 µm, characterized in that said heat treatment comprises two annealing steps under successive following different atmospheres, namely:

a first annealing step under a neutral gas atmosphere, such as nitrogen ($N_2$) or argon (Ar), and a second annealing step under a neutral gas atmosphere such as nitrogen ($N_2$) or argon (Ar) containing $H_2S$, preferably containing more than 0.1%, preferably still more than 1% in a molar proportion of $H_2S$ notably from 3 to 5%.

The method for annealing the thin layers according to the invention is advantageous in that:

The first annealing step gives the possibility of obtaining densification and an increase in the grain size of the layer of particles; and The second annealing step gives the possibility of improving homogeneity, notably reducing the number of defects and/or reducing the content of secondary phases which were able to appear during the first annealing step, and recombining the binary or ternary phases into a quaternary phase CZTS, and/or passivation of the surface of the Mo accessible because of holes present in the layer.

More particularly, the layer is densified and the grains are grown before annealing by means of a first annealing in a neutral atmosphere in the presence of the Mo substrate, which may produce some segregation of phases (such as SnS) and/or an increase in defects. The second annealing in $H_2S$ seems to give the possibility of reducing the defects and/or regenerating CZTS, without degrading the obtained grain size during the first annealing, perhaps by the oxidation of Sn(II) into Sn(IV), which is its degree of oxidation in CZTS.

This annealing method may be carried out with two well-differentiated annealing steps, with a cooling cycle between the two annealing steps and possibly a change in the annealing device, or else, in a single annealing device, with a change in atmosphere while the layer is still in the high temperature range.

In an alternative embodiment, in the first step, said particles of said dispersion of particles may be a mixture of particles of several sulphides of one or two metals selected from Cu, Zn and Sn, preferably particles of a single metal such as $Cu_2S$, CuS, ZnS, SnS, $SnS_2$ or particles with two metals such as Cu—Sn—S.

More particularly, the maximum temperature for both the first and second annealing steps is from 450 to 600° C., preferably from 500 to 590° C., and the duration of the treatment at said maximum temperature is from 10 to 120 minutes, and the duration of the rise in temperature up to the maximum temperature is preferably from 15 to 60 minutes.

Still more particularly, an intermediate cooling step preferably down to room temperature, inserted between the first and second annealing steps, is carried out and preferably the duration of the rise in temperature up to the maximum temperature during said first and second annealing steps is from 30 to 60 minutes.

Preferably, said dispersion of particles is an aqueous, alcoholic or hydro-alcoholic colloidal dispersion, preferably a liquid hydro-alcoholic colloidal dispersion of primary amorphous nanoparticles with sizes from 2 to 100 nm preferably less than 30 nm, notably from 3 to 20 nm.

More particularly, said colloidal dispersion consists in said nanoparticles dispersed in a dispersion solvent consisting in an aqueous, alcoholic or hydro-alcoholic dispersion of amorphous nanoparticles, said alcohol of said solution having a boiling temperature below that of water, said dispersion solvent preferably consisting in a water/ethanol mixture.

Still more particularly, said colloidal dispersion does not contain any organic ligands as defined above. By «primary nanoparticles» are meant here nanoparticles as obtained before their possible subsequent aggregation as an aggregate of a larger size of several primary nanoparticles together.

Obtaining primary nanoparticles of smaller sizes dispersed in aqueous and/or alcoholic solvents of the present invention is advantageous in order to obtain not only in a first phase a stable colloid without adding any ligand but also in a second phase, a homogeneous film with large grains crystallized without any residual impurities of organic ligands in the manufacturing method described hereafter.

Still preferably, said colloidal dispersion is prepared by carrying out the following successive steps of:

a) preparing a first aqueous, alcoholic or hydro-alcoholic solution of precursors of sulphides consisting metal sulphide salt(s), other than copper, zinc and tin salts, preferably in water, said metal sulphide salt(s) being preferably an alkaline or earth-alkaline salt, still preferably a sodium or potassium salt, and b) preparing a second solution of copper, zinc and tin precursors is made, other than copper, zinc and tin sulphides, in solution in a solvent comprising pure acetonitrile or in a mixture with water and/or an alcohol, preferably other than methanol, said copper, zinc and tin salts preferably being a halide, still preferably a chloride, and c) mixing both said first and second solutions of precursors at atmospheric pressure and at room temperature until a crude colloidal dispersion is obtained, and d) separating the solid portion of said colloidal dispersion of step c) preferably by centrifugation in order to obtain a precipitate of the solid after removing the liquid supernatant, and e) rising the solid precipitate obtained in step d) by pouring thereon an aqueous, acetonitrile, alcoholic or hydro-alcoholic solvent in order to re-form the colloidal dispersion, the alcohol of said alcoholic or hydro-alcoholic colloidal dispersion preferably being ethanol, and f) separating again the solid precipitate of said colloidal dispersion of step e) preferably by centrifugation, in order to obtain, after removing the liquid supernatant, a rinsed precipitate as a humid slurry, and g) preferably, steps e) and f) for rinsing the colloid are repeated once or several times, by centrifugation and then re-dispersion in an aqueous, alcoholic or hydro-alcoholic solvent.

More particularly, in step g), said humid slurry of step f) is re-dispersed in a dispersion solvent comprising, preferably consisting in an aqueous, alcoholic or hydro-alcoholic dispersion, the alcohol of said alcoholic or hydro-alcoholic solution if necessary being a non-toxic alcohol, notably an alcohol other than methanol.

According to the present invention, in the method for preparing the colloidal dispersion, preliminary preparation at room temperature or requiring reduced heating of two separate solutions of precursors based on Cu, Zn and Sn salts and respectively on sulphide with different solvents, is carried out, without adding any ligand, notably in steps a) and b), and they are mixed at a reduced temperature notably at room temperature and at atmospheric pressure as defined in steps a) to c).

By «ligand» is meant here an organic molecule able to bind and/or to complex one or several of the Cu, Zn or Sn metals, notably an organic molecule substituted with at least one group selected from amine ($-NH_2$), thiol ($-SH$), amide or thioamide groups notably $-CONH_2$ or $-CSNH_2$, and/or organic acid groups (such as the carboxylic acid group $-COOH$ or a phosphoric acid group, notably $-PO_3H_2$).

A colloidal dispersion stable at room temperature, obtained without adding any ligand comprises less residual impurities, which contributes to improving the quality of a film obtained after deposition of the colloidal dispersion and annealing of the resulting layer as described hereafter. In particular, this contributes to obtaining a continuous and more homogenous crystallized film with large grains and with better photovoltaic performances.

Preferably, in step g), a dispersion solvent is applied, consisting in an aqueous, alcoholic or hydro-alcoholic dispersion, the alcohol of said alcoholic or hydro-alcoholic solution being a non-toxic alcohol having a boiling temperature below the boiling temperature of water, preferably ethanol or propanol, still preferably consisting in a water/ethanol mixture.

These dispersion solvents were selected for their property of dispersion of amorphous nanoparticles (concentration, stability of the colloid, viscosity, non-toxicity), giving the possibility of forming a liquid, homogenous and stable colloid with amorphous nanoparticles of small sizes, which do not naturally precipitate at room temperature before at least 24 hours, and may be deposited by spraying (viscosity, vapour pressure and evaporation temperature) under optimum conditions in order to obtain a homogenous continuous film and without any impurities as described hereafter.

An alcohol having a boiling point of less than that of water is advantageous since in a method for manufacturing a film obtained by deposition, by spraying and annealing of the colloidal dispersion on a substrate as described hereafter, during contact of the colloidal solution on the hot plate of the substrate, there is evaporation of the solvents and it appears to be preferable that the alcohol evaporates before the water in order to set aside the risks of residual contamination with carbon from said alcohol inside said film.

Ethanol and propanol are preferred because of their total miscibility in water, in addition to their boiling temperature below that of water (and a vapour pressure above that of water).

The room temperature used for preparing the solutions as well as during the mixing of steps a) to c) is defined as being a temperature comprised between 0° C. and 50° C., preferably from 20 to 40° C.

This method for preparing a colloidal dispersion according to the invention is therefore particularly advantageous in that:
- it is carried out at a reduced temperature notably at room temperature and at atmospheric pressure,
- it is quasi-instantaneous and provides a homogeneous and stable colloid, and
- it allows the application of an aqueous solvent in the absence of any toxic solvent and/or organic ligand with a covalent bond, and
- acetonitrile is not a dangerous or toxic solvent and gives the possibility of protecting the atoms of the metal cations against oxidation or against hydrolysis of the precursors and/or of the formed particles, without being engaged in a covalent bond unlike a ligand.

The rapidity of the reaction in step c), typically conducted within an elapses time of less than minute, even less than 5 seconds, is the consequence of the lack of a ligand complexing and binding said metal and of the concomitant presence of a sulphide precursor.

This reaction rapidity of the precursors in step c), contributes to obtaining amorphous nanoparticles and with small sizes, the nanoparticles not having the time for growing to the expense of others.

On the other hand, the high concentrations and small sizes of nanoparticles gives greater stability to the colloid of nanoparticles obtained in step c), the latter remaining stable for at least two days at room temperature.

With the obtained colloidal dispersion, it is further possible to obtain a film of large grain crystalline Cu, Zn and Sn sulphide(s) according to the object of the present invention after deposition and annealing of a layer of amorphous Cu, Zn and Sn sulphide nanoparticles on a substrate.

This method for preparing a colloidal dispersion is particularly advantageous in that:
- it is carried out at room temperature and at atmospheric pressure,
- it is quasi-instantaneous and provides a stable colloid,
- it allows application of an aqueous solvent in the absence of any toxic solvent and/or organic ligand with a covalent bond and without adding any acid,
- acetonitrile is not a dangerous or toxic solvent and gives the possibility of protecting the atoms of the metal cations against oxidation or against hydrolysis of the precursors and/or of the formed particles, without being engaged into a covalent bond unlike a ligand, and
- the reaction by-products are more easily dissolved and removed by means of a lesser number of rinsing steps with aqueous, alcoholic or hydro-alcoholic rinsing solvents.

The colloidal dispersion obtained is stable and further gives the possibility of obtaining a compact large grain film of crystalline metal sulphide(s) according to the object of the present invention after deposition and double annealing of a layer of amorphous Cu, Zn and Sn sulphide nanoparticles on a substrate.

Still preferably, in the method for preparing the colloidal dispersion:
- in step a), said first aqueous solution of NaSH is made, and
- in step b), said second solution is made containing $CuCl_2$, $ZnCl_2$ and $SnCl_4$ in acetonitrile mixed with water, preferably in an acetonitrile/water volume ratio of at least 50/50, or still preferably in pure acetonitrile, and
- in step c), amorphous nanoparticles of Cu, Zn and Sn sulphide(s) are obtained, preferably a CZTS compound with a size from 3 to 20 nm.

Still more particularly, in step 1), a said colloidal hydro-alcoholic dispersion with a carrier gas consisting of a gas without any oxygen, preferably a neutral gas, still preferably nitrogen is sprayed at atmospheric pressure and at a substrate temperature brought to at least 100° C., in order to form on a said substrate, a thickness layer from 0.5 to 15 μm, preferably from about 0.5 to 10 μm before annealing.

In a preferred embodiment of the method for preparing a thin film according to the invention, after step 2) for a double annealing heat treatment, a step for chemically cleaning said layer by means of an acid solution, preferably an HCl solution, is carried out and then said thin layer is rinsed with water and dried. This chemical cleaning treatment gives the possibility of improving the performances of a photovoltaic device containing a said thin absorber layer, as demonstrated hereafter.

Advantageously, said substrate is a substrate intended to be covered with a type p semiconductor absorption layer in a solid photovoltaic device.

More particularly, said substrate consists of a glass or steel layer covered with a so-called rear contact layer consisting of a molybdenum layer, useful in a solid photovoltaic device of the substrate type.

In a solid photovoltaic device said to be of the substrate type, the above layers are completed with:
- a metal grid applied against said front contact layer, thus forming the front face (on the sun side) of the device, and
- a glass or steel layer applied against said rear contact layer.

The present invention also provides a thin and compact layer of an absorber material essentially consisting of Cu, Zn and Sn sulphide(s) with atomic percentages of the three metals Cu, Zn and Sn which may vary in the interval from x=40 to 60% for Cu and y=15 to 35% for Zn and z=15 to 35% for Sn, with x+y+z=100% of a homogeneous composition consisting essentially of CZTS, with large crystal grains of average sizes of at least 500 nm placed side by side in direct contact with each other, said thin absorber layer with a thickness from 0.5 to 5 μm, preferably from 0.5 to 3 μm, said thin absorber layer being deposited on a molybdenum layer of a substrate, preferably glass, covered with a said molybdenum layer, obtained by the method according to the invention.

Still more particularly, said thin layer of absorber material according to the invention is a compact layer deposited on said substrate so that the covering level of the surface of the substrate by said layer is more than 95%, preferably more than 98%, and has a porosity of less than 10%, preferably a porosity of less than 1%. By <<porosity>> is meant here the percentage of empty volume between said large grains placed side by side within the layer.

This property of covering the surface of the substrate obtained by the method according to the invention, with a covering level of more than 95%, is original and advantageous in that it avoids direct contact between both layers adjacent to the film and thus gives the possibility of avoiding electric short-circuits of the photovoltaic device.

It is understood that the covering level of less than 100% results from the fact that open empty spaces may subsist between portions of the external surfaces of the grains not in contact with each other because the adjacent grains are placed side by side in direct contact on only a portion of their external surface.

Said thin layer of absorber material of a homogenous composition, essentially and exclusively consists of large crystal grains of CZTS placed side by side in direct contact with each other and contains no or few crystalline secondary phases, in particular of sulphides of only one or two metals selected from Cu, Zn and Sn, notably no or few SnS The present invention also provides a photovoltaic device comprising an absorption layer consisting of a thin layer of absorber material deposited on a substrate according to the invention.

More particularly, the film has a surface roughness with an arithmetic mean height of the peaks Sa, according to the ISO 25178 standard, of less than half the thickness of the film, preferably less than 0.2×e, preferably still less than 0.15×e for a surface of at least 20×20 μm². The measurement of the surface roughness of a film was conducted with an atomic force microscope (AFM) and a scanning local probe microscope (SPM), of the AFM/SPM version from Agilent Tech. (U.S.A.), series 5100.

The larger the roughness, the larger is the actual surface of the layer and the more there may be surface recombinations which reduce the photovoltaic yield of the photovoltaic device containing a so-called absorber layer.

More particularly, the present invention provides a photovoltaic device according to the invention comprising successively stacked layers:
- a substrate, preferably sodium-lime glass covered with a thin conducting layer of molybdenum being used as a rear electric contact layer,
- a said thin layer of absorber material, essentially consisting of CZTS,
- a buffer layer, preferably a layer made on the basis of cadmium sulphide CdS,
- a transparent front contact conductive layer, preferably a layer of a first so-called intrinsic (non-doped) ZnO layer, covered with a transparent conductive layer, preferably of indium tin oxide (ITO) or aluminium zinc oxide (AZO), and
- thin metal collectors on said transparent front face electric contact layer, i.e. a metal grid (of aluminium, nickel and/or silver).

Other features which give advantage to the present invention will become apparent in the light of the detailed exemplary embodiments which will follow with reference to the following figures.

In the examples hereafter, when double annealing is carried out, during the first step, the atmosphere of the gas exclusively consists of nitrogen or argon, and during the second step, the atmosphere consists of nitrogen or argon containing 3% of $H_2S$ designated in the present description by «$H_2S$ atmosphere».

Figure 1B:
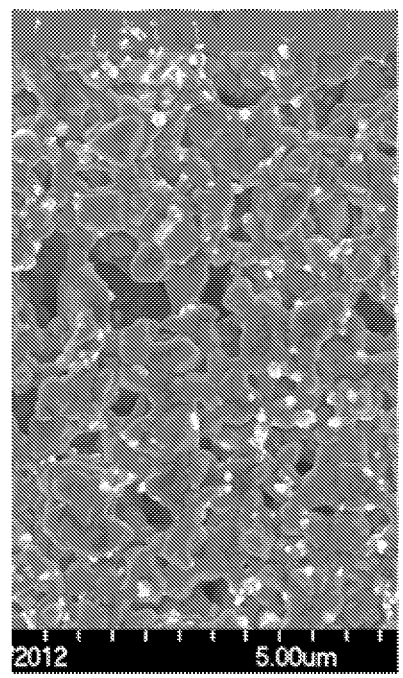

FIGS. 1A and 1B show two SEM images of CZTS layers in a top view: compact and with large grains like the one obtained in Example 1, annealed according to the invention (FIG. 1A) and porous like in the comparative Example 4, annealed with a single step under an $H_2S$ atmosphere (FIG. 1B).

Figure 2:
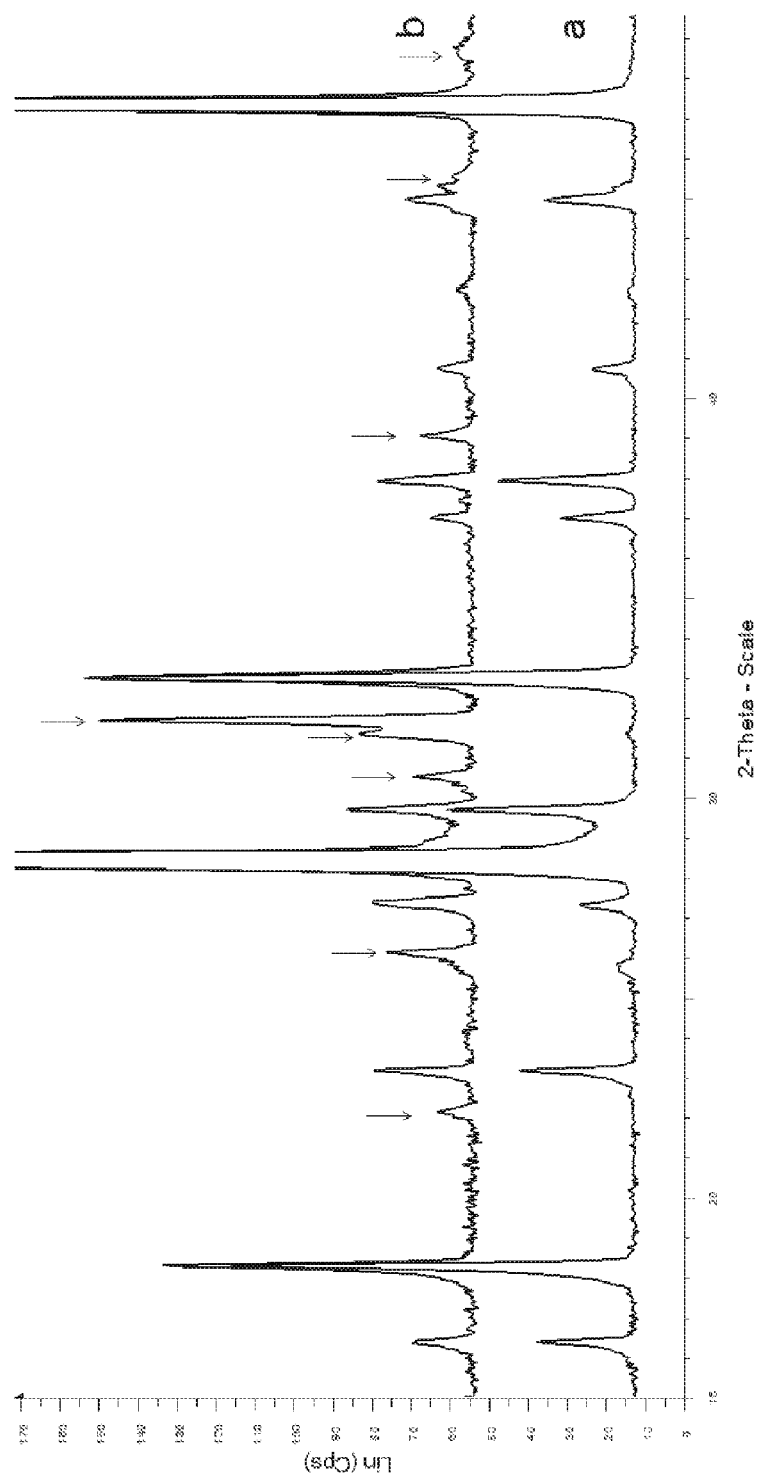

FIG. 2 shows two x-ray diffractograms (XRD) of CZTS layers: the layer obtained in Example 1, annealed according to the invention (diffractogram a); and the layer obtained in the comparative Example 3, annealed with a single step under an $N_2$ atmosphere (diffractogram b). The diffractograms were obtained with a commercial instrument using the Cu Kα radiation. The arrows on the diffractogram (b) correspond to the secondary phase SnS. The Cps («counts per second») values in ordinates are according to a linear scale («Lin»).

Figure 3:
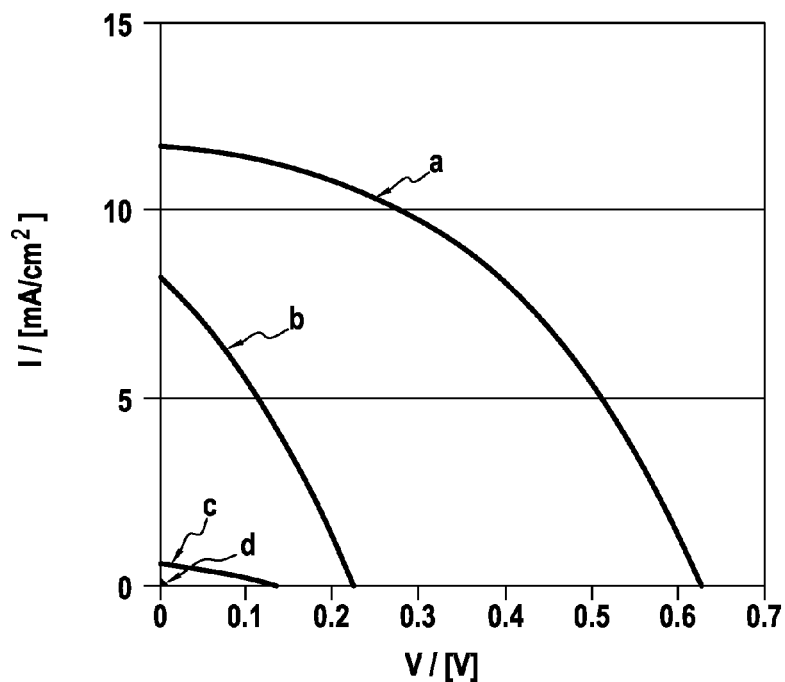

FIG. 3 illustrates I-V curves of CZTS photovoltaic devices: the curve (a) corresponds to an annealed CZTS layer according to the method of the invention, according to Example 2, the curve (b) corresponds to a CZTS layer annealed in one step under an $N_2$ atmosphere, according to comparative Example 3; the curve (c) corresponds to a CZTS layer annealed in a step under an $H_2S$ atmosphere, according to comparative Example 4; the curve (d) corresponds to a CZTS layer annealed in two steps (the first under $N_2$, the second under SnS and S vapours), according to comparative Example 8.

Figure 4:
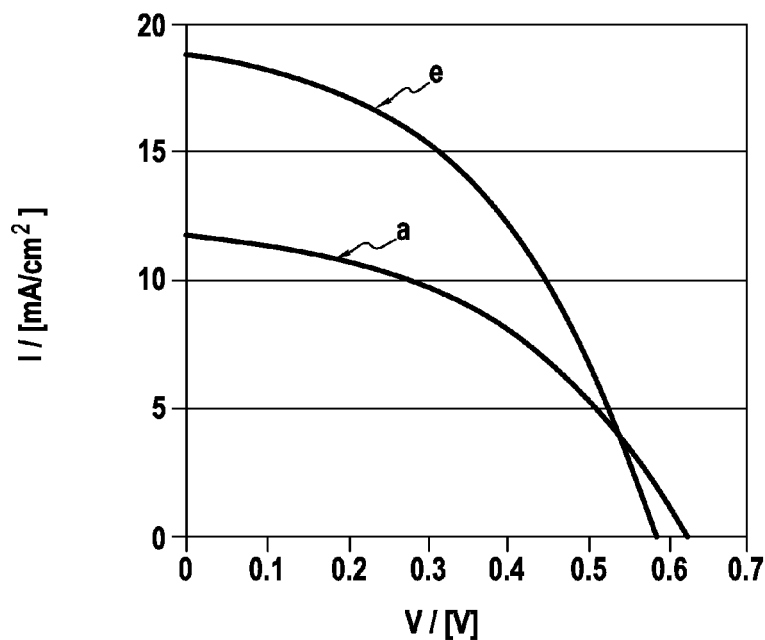

FIG. 4 illustrates the I-V curves of the photovoltaic devices comprising a CZTS layer annealed according to the method of the invention: the curve (a) corresponds to a CZTS layer annealed according to Example 2, the curve (e) corresponds to a CZTS layer annealed according to Example 3, with an additional step for chemical cleaning with hydrochloric acid of the CZTS layer after annealing and before depositing the CdS buffer layer.

The morphology of the CZTS layers (thickness, covering level, porosity, grain size) may be checked by scanning electron microscopy (SEM), also optionally by transmission electron microscopy (TEM), in different areas of the layer, in top views or in edge views.

The crystalline phases present in the CZTS layers may be analysed by x-ray diffraction (XRD), typically with a grazing angle from 1 to 3 degrees.

The average elementary composition of the layers may be analysed by x-ray spectroscopy with energy dispersion (energy dispersive x-ray spectroscopy, EDX or EDS), coupled with an SEM instrument, on surfaces with a size of tens or hundreds of micrometers. The homogeneity of the elementary composition may be further evaluated by EDX mapping in top views.

The photovoltaic performance of the photovoltaic devices is measured from current-voltage (I-V) curves under irradiation of a solar simulator with a standard power of 1,000 W/m². From these curves, the conversion yield of the incident radiation into electric power is calculated at the maximum power point, and other performance parameters such as the photocurrent for a short-circuit and the voltage for an open circuit.

In Example 1, the manufacturing of a thin CZTS layer is described by using a colloidal dispersion of CZTS particles and the double annealing method of the present invention. Each annealing step comprises a ramp for raising the temperature from room temperature up to the maximum temperature (typically within a period of 50 minutes), followed by a plateau at this maximum temperature (typically from 15 to 60 minutes), followed by cooling down to room temperature.

In Example 2, the manufacturing of a photovoltaic device made with the thin CZTS layer of Example 1 is described. In the comparative Examples 3 to 6, layers and devices made with the same technique and then annealed according to an annealing method in a single step (a single atmosphere) are described.

The CZTS layer of the comparative Example 3, annealed under a neutral nitrogen atmosphere, is compact and has large grains (of the order of one micrometer). It has secondary crystalline phases especially of SnS, as shown by x-ray diffraction analysis (XRD); EDX mapping shows a few areas which are richer in Cu and a few areas which are richer in Zn as compared with the average composition of the layer. Photovoltaic devices made with this type of layer exhibited low yield, of less than 1%.

The CZTS layer of the comparative Example 4, annealed under an atmosphere containing $H_2S$ gas diluted in argon or in nitrogen, exhibits very few or no secondary crystalline phases such as SnS, as shown with XRD. The layers are not sufficiently dense and the grains are not sufficiently large. Photovoltaic devices made with this type of layer have a very low performance.

The CZTS layer of the comparative Example 5, annealed under an atmosphere containing elementary S vapour, has very few or no secondary phases such as SnS, as shown with XRD. The layers are not sufficiently dense and the grains are not sufficiently large.

The CZTS layer of the comparative Example 6, annealed under an atmosphere containing SnS vapour, has few secondary phases like SnS, (estimated to be at less than 1%), as shown with XRD. The layers are not sufficiently dense and the grains are not sufficiently large.

The CZTS layer of Example 1 was annealed in two steps, a first step under a neutral $N_2$ atmosphere, and a second one under an $H_2S$ atmosphere diluted in $N_2$ or Ar. After the second annealing step, the layer keeps the compactness and the grain size obtained after the first step. It has no or few secondary phases such as SnS (estimated to be at least 0.5%), as shown by XRD; EDX mapping shows a few areas rich in Zn, no differentiated areas rich in Cu, the remainder being homogeneous, with the same level as the average of the layer.

The CZTS photovoltaic devices of Example 2 made with annealed layers of Example 1 with this annealing method in two steps exhibited considerably improved photovoltaic performances, notably, yields of more than 3% and open-circuit voltages of more than 0.45 V, and more particularly above 0.5 V. The performance of these devices may be improved by more accurate adjustment of the composition of the layer (as known in the state of the art) and by adjustments of the thicknesses and compositions of ancillary layers (buffer layer, front and rear conducting layer).

In the comparative Example 10, the effect of the Mo substrate is shown as compared with a glass substrate during annealing in a neutral atmosphere; the Mo substrate gives the possibility of obtaining a compact layer, unlike the glass substrate.

In Example 11, the manufacturing of a photovoltaic device made with the thin CZTS layer of Example 1 is described, followed by a chemical cleaning step, the photovoltaic device being finished like in Example 2.

Table 1 hereafter summarizes the results of the analyses of the CZTS layers on a Mo substrate after several types of annealing in one step.

Other annealings were carried out in two steps, wherein the first step was annealing under $N_2$ and the second step was annealing in an atmosphere containing S, SnS+S, or $SnS_2$ vapours, as described in the comparative Examples 7 to 9, the morphology or the homogeneity of the layers and/or the photovoltaic performance not being satisfactory.

Table 2 hereafter summarizes the results of the analyses of the CZTS layers on a Mo substrate after several types of annealing in two steps.

Table 3 hereafter summarizes the performances of the devices made with CZTS layers on Mo annealed with different annealing methods.

Annealing was carried out with a temperature raising ramp of 50 minutes from room temperature up to the maximum temperature, followed by a plateau at this maximum temperature, followed by cooling down to room temperature either naturally or forced in order to cool faster.

TABLE 1

Analysis of the CZTS layers on a Mo substrate after several types of annealing in one step; a CZTS layer on a glass substrate (without Mo) is added as a comparison.

| Description of the annealing | Morphology (SEM) Compactness | Grain size | Phases other than CZTS assigned by XRD | Homogeneity Cu—Zn—Sn mapping by EDX |
|---|---|---|---|---|
| No annealing | Not dense | ~10 nm | Amorphous | Homogenous No differentiated areas |
| 525° C. 15-60 min, under $N_2$ | Dense | 1 μm | SnS | Areas rich in Cu, or in Zn, or slightly in Sn |
| 525° C. 15 min, under $N_2$; glass substrate without Mo | Not dense | <500 nm | No SnS | |
| 525° C. 15-60 min, under SnS atmosphere | Not dense | <500 nm | SnS | |
| 550° C. 60 min, under SnS atmosphere | Dense | ~1 μm | SnS | |
| 550° C. 60 min, under S atmosphere | Not dense | <500 nm | SnS | |
| 570° C. 60 min, under S atmosphere | Not dense | 500 nm-1 μm | No SnS | |
| 600° C. 60 min, under S atmosphere | Not dense* | <500 nm-1 μm | No or very little SnS | |
| 525° C. 60 min, under a $H_2S$ atmosphere | Not dense | <500 nm | No or very little SnS | |
| 600° C. 60 min, under a $H_2S$ atmosphere | Not dense* | <500 nm | No or very little SnS | |

*the glass substrate is curved after annealing

TABLE 2

Analyses of the CZTS layer on a Mo substrate after several types of annealing in two steps

| $1^{st}$ annealing step | $2^{nd}$ annealing step | Morphology (SEM) | Phases other than CZTS assigned by XRD | Homogeneity Cu—Zn—Sn mapping by EDX |
|---|---|---|---|---|
| 50' ramp, 525° C. 15 min, under $N_2$ | 50' ramp, 525° C. 60 min, under $H_2S$ | Dense Grains ~1 μm | No or very little SnS | Small areas slightly rich in Zn |
| 50' ramp, 525° C. 15 min, under N2 | 50' ramp, 525° C. 60 min, under S | Dense Etched Grains | SnS | |
| 50' ramp, 525° C. 15 min, under N2 | 50' ramp, 525° C. 60 min, under SnS + S | Dense Presence of an overlayer with a different aspect | Very little SnS | |

TABLE 2-continued

Analyses of the CZTS layer on a Mo substrate
after several types of annealing in two steps

| 1st annealing step | 2nd annealing step | Morphology (SEM) | Phases other than CZTS assigned by XRD | Homogeneity Cu—Zn—Sn mapping by EDX |
|---|---|---|---|---|
| 50' ramp, 525° C. 15 min, under N2 | 50' ramp, 525° C. 60 min, under SnS$_2$ | Dense | Very little SnS | |

TABLE 3

Performances of the devices made with CZTS layers on Mo, annealed
with different methods and measured with an irradiation of a 1,000
W/m$^2$ at 25° C. according to Examples 1 to 10.

| 1st annealing step | 2nd annealing step | Yield [%] | Photo-current [mA/cm$^2$] | Open circuit voltage [V] |
|---|---|---|---|---|
| 50' ramp, 525° C. 15 min, under nitrogen | — | <0.6% | <8 mA/cm$^2$ | <0.25 V |
| 50' ramp, 525° C. 60 min, under H$_2$S | — | <0.1% | <1 mA/cm$^2$ | <0.1 V |
| 50' ramp, 525° C. 15 min, under N2 | 50' ramp, 525° C. 60 min, under SnS + S | Low | Low | <0.005 V |
| 50' ramp, 525° C. 15 min, under N2 | 50' ramp, 525° C. 60 min, under SnS$_2$ | Low | Low | <0.015 V |
| 50' ramp, 525° C. 15 min, under N2 | 50' ramp, 525° C. 60 min, under H$_2$S | >3% | 10-17 mA/cm$^2$ | 0.45-0.63 V |

EXAMPLE 1

Manufacturing a thin CZTS layer by using a colloidal dispersion of CZTS and annealed with an annealing method in two steps, a first one in a neutral atmosphere, and a second in an H$_2$S.A atmosphere). Preparation of a CZTS colloid.

A colloid of Cu—Zn—Sn—S nanoparticles was made by reacting a mixture of metal salts of CuCl, ZnCl$_2$ and SnCl$_4$.5H$_2$O in water/acetonitrile with an aqueous NaSH solution, at room temperature and under a neutral nitrogen atmosphere, according to the global reaction:

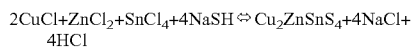

2CuCl+ZnCl$_2$+SnCl$_4$+4NaSH ⇌ Cu$_2$ZnSnS$_4$+4NaCl+4HCl

This reactive system is adapted in the sense that the reaction by-products, for example NaCl or HCl, are soluble in water while the nanoparticles are solid and dispersed as a colloid.

A 0.12 M aqueous solution of NaSH in deionized water was prepared. A solution of metal chlorides of copper, zinc and tin as mentioned above was prepared in acetonitrile in a glove box with nitrogen, at a concentration of ~0.5 M of Cu, ~0.25 M of Zn and ~0.25 M of Sn (typically 469 mg of CuCl, 415 mg of ZnCl$_2$ and 893 mg of SnCl$_4$.5H$_2$O in 10 ml of acetonitrile). One volume of the metal chloride solution was taken, and 4 volumes of acetonitrile and 5 volumes of water were added. To this solution, were added 10 volumes of the NaHS solution, rapidly giving a colloidal dispersion. The thereby obtained colloid is washed in water and ethanol with successive centrifugation steps, removal of supernatant and re-dispersion. The precipitate after the last centrifugation is re-dispersed (and concentrated relatively to the initial volume) by adding 5 volumes of ethanol.

The particles of the rinsed colloid were analysed by transmission electron microscopy TEM, which showed nanoparticles with a rounded shape, agglomerated and typically with sizes between 2 and 7 nm.

A few drops of the colloid were deposited on a glass substrate in a glove box in nitrogen, left to dry, and the dry deposit of the colloid was then annealed in nitrogen for one hour at 525° C. XRD characterization gave the typical peaks of Cu$_2$ZnSnS$_4$; elementary analysis by EDX of the annealed deposit gave average percentages Cu:Zn:Sn (statistics over several batches) of 48:29:23.

B) Preparation of a Crystallized CZTS Film on a Glass Substrate Covered with Molybdenum.

Deposition of the CZTS film was accomplished by spraying in a glove box filled with nitrogen. A colloidal dispersion was prepared by mixing 2 volumes of the final ethanol colloidal dispersion obtained according to paragraph A above with 18 volumes of water. Commercial sodium-lime glass substrates with a Mo layer, of dimensions 2.5×2.5 cm, were placed on a heating plate at a temperature of 300° C. The nozzle of the spray used was a flask for spraying on a specimen in borosilicate glass. For injecting the colloidal solution into the nozzle, application of nitrogen pressure was controlled intermittently: open for 0.3 seconds and then a waiting period of 1.7 seconds, this 2 second cycle being maintained during the duration for the deposition, which was of 2 minutes and a half. The nozzle-substrate distance was about 15 cm with an average flow of nitrogen carrier gas of 14 L/min at a nitrogen cylinder pressure of 0.2 bars above atmospheric pressure. A uniform coloured layer was thus obtained upon examination.

A first annealing step under an N$_2$ atmosphere was carried out on a heating plate placed in a glove box filled with dry nitrogen, with a plateau at 525° C. for 15 min (with a rise in temperature designated hereafter by «ramp») for 50 minutes followed by natural cooling down to room temperature around 25-30° C.

A second annealing step under a H$_2$S atmosphere was carried out in a tubular oven, under a flow of 3% H$_2$S in argon, with a plateau at 525° C. for 60 minutes with a rise in temperature for 50 minutes and natural cooling down to a room temperature of 20-40° C.

After this double annealing, the layer was dense or compact and the grain size was of the order of 1 μm, according to an SEM analysis in a top view. A view of a section of the film obtained after annealing exhibited thickness of the CZTS film around 2 to 3 μm. The film has a surface roughness with an arithmetic mean height of the peaks, Sa, of 250 nm for analysis surfaces of at least 20×20 μm$^2$. According to XRD analysis, the peaks corresponding to the secondary crystalline phase SnS (as shown in FIG. 2) were not present or they were very small (for different samples made under the same conditions). EDX mapping of the elementary atomic composition of the three metals in the layer revealed a few micrometric areas slightly richer in Zn by more than 10% relatively to the average Cu:Zn:Sn percentage of the layer.

EXAMPLE 2

Manufacturing a photovoltaic device of the thin layer type made with a CZTS layer manufactured and annealed like in Example 1.

On the CZTS layer of Example 1, a buffer layer of CdS of about 50 nm was deposited by chemical deposition (chemical bath deposition, CBD), according to the usual procedure of the state of the art. On this layer, a transparent ZnO layer of about 50 nm was successively deposited, followed by a transparent conductive layer of Sn-doped indium oxide (ITO) of about 250 nm, by magnetron cathode sputtering, by using a commercial apparatus. Subsequently, the substrate was divided into 16 electrically insulated cells, with dimensions of 0.5×0.5 cm. A small silver spot was deposited (by drying a silver-loaded paint) onto the transparent front contact layer in order to collect the current and place one of the contacts for measuring the photovoltaic performance. The second contact was directly made on the Mo at the edge of the substrate.

The photovoltaic yield was measured with a standard test by producing current-voltage curves under a solar simulator, as described in patent FR2899385.

The photovoltaic yield (or photovoltaic efficiency) was calculated from electric current-voltage characteristics of the photovoltaic diode measured under light irradiation. The conversion yield is the percentage of the electric power delivered by the device at the maximum power point, relatively to the power of the incident radiation: $\eta$=(electric power at the maximum power point)/(power of the incident radiation). This photovoltaic efficiency was measured with an electric test bench and which uses a solar simulator delivering an irradiation of 1,000 W/m$^2$ corresponding to the AM1.5G standard. The measurement bench was calibrated according to the standard procedure on the basis of the known photo-current of reference cells, as provided by various recognized official institutes.

The best performance was a yield of more than 3%, with open-circuit currents from 10 to 17 mA/cm$^2$ and open circuit voltages from 0.45 to 0.63 V.

COMPARATIVE EXAMPLE 3

Manufacturing of a thin CZTS layer by using a colloidal dispersion of CZTS and annealed with a single annealing step in a neutral N$_2$ atmosphere, and of a photovoltaic device of the thin layer type made with this layer.

A layer was prepared like in Example 1, but only annealed with the first step under an N$_2$ atmosphere. Before annealing, the layer was porous and formed with small grains of the order of ~10 nm. After this annealing, the layer was dense and the grain size was of the order of 1 µm. According to XRD analysis, in addition to the CZTS phase, peaks were detected corresponding to the SnS phase. EDX mapping of the elementary atomic composition of the three metals in a few portions of the layer revealed a few micrometric areas very rich in Cu (more than 25%), or richer in Zn, or in Sn relatively to the average Cu:Zn:Sn percentage of the layer.

Other annealing conditions (by reducing the temperature rise time or by increasing the temperature of the plateau) gave similar results.

With this layer, photovoltaic devices were manufactured by following the procedure of Example 2. The best yield was less than 0.6%, the short-circuit currents were less than 8 mA/cm$^2$ and the open circuit voltages were less than 0.25 V.

COMPARATIVE EXAMPLE 4

Manufacturing a thin CZTS layer by using a colloidal dispersion of CZTS and annealed with a step in a H$_2$S atmosphere, and a photovoltaic device of the thin layer type made with this layer.

Layers were prepared like in Example 1, but only annealed with a single step, under an H$_2$S atmosphere (diluted in nitrogen or argon), in a similar way to the second step of Example 1, with a temperature of the plateau between 525 and 600° C.

The layer after this annealing was not dense, but porous, and the grain size was less than 500 nm. According to XRD analysis, the peaks corresponding to the secondary phase SnS were not present or they were very small (for various samples made under the same conditions).

With layers annealed at 560° C., photovoltaic devices were manufactured by following the procedure of Example 2. The best yield was <0.1%, the short-circuit currents were less than 1 mA/cm$^2$ and the open circuit voltages were less than 0.1V.

COMPARATIVE EXAMPLE 5

Manufacturing a thin CZTS layer by using a colloidal dispersion of CZTS and annealed with a step in an atmosphere containing S vapour.

Layers were prepared like in Example 1, but only annealed with a single step, under an atmosphere containing S vapour. The annealing was carried out on a heating plate placed in a glove box filled with dry nitrogen: A crucible containing S powder was placed beside the layer to be annealed, both covered by a glass bell, on a heating plate with a lid. The heating cycle was similar to that of the annealing under N$_2$ of Example 3, with a plateau between 550 and 600° C.

The layer after this annealing was not dense, but porous. The grain size was less than 500 nm for the plateau at 550° C., and ~500 nm-1 µm or less for the plateaux at 570-600° C. According to XRD analysis, the peaks corresponding the secondary phase SnS were not present or were too small (for various samples made under the same conditions).

COMPARATIVE EXAMPLE 6

Manufacturing a thin CZTS layer by using a colloidal dispersion of CZTS and annealed with a step in an atmosphere containing SnS vapour.

Layers were prepared like in Example 1, but only annealed with a single step, under an atmosphere containing SnS vapour. The annealing was carried out on a heating plate placed in a glove box filled with dry nitrogen: A crucible containing SnS powder was placed beside the layer to be annealed, both covered by a glass bell, on a heating plate with a lid. The heating cycle is similar to that of the annealing under N$_2$ of Example 3, with a plateau between 525 and 550° C.

The layer after the annealing with the plateau at 525° C. was not dense but porous and the grain size was less than 500 nm. The layer after the annealing with the plateau at 550° C. was dense and the grain size was of the order of 1 µm. According to XRD analyses, the peaks corresponding to the secondary phase SnS were present for the layer after the annealing with the plateau at 525° C., and they were more intense for the layer after the annealing with the plateau at 550° C.

COMPARATIVE EXAMPLE 7

Manufacturing a thin CZTS layer by using a colloidal dispersion of CZTS and annealed with an annealing method in two steps, a first one in a neutral atmosphere, and a second one in an atmosphere containing S vapour.

A layer was prepared like in Example 1, annealed with two steps, a first step under an N$_2$ atmosphere (like in Example 1), and a second step in an atmosphere containing S vapour (and not H$_2$S like in Example 1). The second annealing step was carried out on a heating plate placed in a glove box filled with dry nitrogen: A crucible containing S was placed beside the layer to be annealed, both covered by a glass bell, on a heating plate with a lid. The heating cycle was similar to that of the annealing under $N_2$ of Example 3, with a plateau at 525° C.

The layer after this annealing was dense, but the grains exhibited at the surface a corroded aspect different from that of Example 1, as if it had been etched. According to XRD analysis, the peaks corresponding to the secondary phase SnS were present.

COMPARATIVE EXAMPLE 8

Manufacturing a thin CZTS layer by using a colloidal dispersion of CZTS and annealed with an annealing method in two steps, a first annealing step in a neutral atmosphere, and a second step in an atmosphere containing SnS and S vapours, and of a photovoltaic device of the thin layer type made with this layer.

A layer was prepared like in Example 1, annealed with two steps, a first step under an $N_2$ atmosphere (like in Example 1), and a second step in an atmosphere containing SnS and S vapours (and not $H_2S$ like in Example 1). The second annealing step was carried out on a heating plate placed in a glove box filled with dry nitrogen: A crucible containing SnS and S powder was placed beside the layer to be annealed, both covered by a glass bell, on a heating plate with a lid. The heating cycle was similar to that of the annealing under $N_2$ of Example 3, with a plateau at 525° C.

The layer after this annealing was dense, with the presence of an overlayer with an aspect different from that of Example 1, without well-defined grain boundaries. According to XRD analyses, the peaks corresponding to the secondary phase SnS were very small.

With this layer, photovoltaic devices were manufactured following the procedure of Example 2. The performances were very low, with very low short-circuit currents and open circuit voltages.

COMPARATIVE EXAMPLE 9

Manufacturing a thin CZTS layer by using a colloidal dispersion of CZTS and annealed with an annealing method in two steps, a first one in a neutral atmosphere, and a second one in an atmosphere containing $SnS_2$ vapour, and of a photovoltaic device of the thin layer type made with this layer.

A layer was prepared like in Example 1, annealed with two steps, a first step under a $N_2$ atmosphere (like in Example 1), and a second step in an atmosphere containing $SnS_2$ vapour (and not $H_2S$ like in Example 1). The second annealing step was carried out on a heating plate placed in a glove box filled with dry nitrogen: A crucible containing $SnS_2$ powder was placed beside the layer to be annealed, both covered by a glass bell on a heating plate with a lid. The heating cycle was similar to that of the annealing under $N_2$ of Example 3, with a plateau at 525° C.

The layer after this annealing was dense. According to XRD analyses, the peaks corresponding to the secondary phase SnS were very small.

With this layer, photovoltaic devices were manufactured by following the procedure of Example 2. The performances were very low, with very low short-circuit currents and open circuit voltages.

COMPARATIVE EXAMPLE 10

Manufacturing a thin CZTS layer on a glass substrate, without any molybdenum layer, by using a colloidal dispersion of CZTS and annealed with a single annealing step in a neutral $N_2$ atmosphere.

A layer was prepared like in Example 3, but on a sodium-lime glass substrate without any molybdenum layer, and only annealed with the first step under an $N_2$ atmosphere. The layer was not dense, but porous, and the average grain size was less than 500 nm.

EXAMPLE 11

Manufacturing of a photovoltaic device of the thin layer type made with a CZTS layer manufactured and annealed like in Example 1, and finalized like in Example 2 but with a chemical cleaning step.

The CZTS layer of Example 1 was immersed in a solution of 8% by weight hydrochloric acid, HCl, for 1 to 2 minutes. It was then rinsed with deionized water and dried under a nitrogen flow. Immediately after this, the buffer layer CdS and the remainder of the layers were deposited for finishing the photovoltaic device like in Example 2.

The layer shown in this example had a thickness and roughness identical with that of Example 2.

The best performances gave yields of 5%, with short-circuit currents up to 19 $mA/cm^2$, superior to the devices of Example 2 where the chemical cleaning treatment with an acid solution had not been carried out, as shown in FIG. 4.

It should be noted that the Vco and the form factor for the obtained photovoltaic device according to this example are in the same range of values as for the photovoltaic devices of Example 2.

Other chemical cleaning operations, such as with ammonia or potassium cyanide solutions, did not improve the performances.

The invention claimed is:
1. A method for manufacturing a thin absorber material layer consisting essentially of Cu, Zn, and Sn sulphide(s), with atomic percentages of the three metals Cu, Zn, and Sn which may vary in the interval from x=40 to 60% for Cu, and from y=15 to 35% for Zn, and from z=15 to 35% for Sn, with x+y+z=100%, as a quaternary compound Cu—Zn—Sn—S, designated hereafter as a CZTS compound with large crystal grains of average sizes of at least 500 nm, said thin absorber layer being deposited on layered material(s) forming a substrate, wherein the following successive steps are carried out:
   1) a layer is deposited by means of a dispersion of particles, as a liquid or a slurry, all of said particles being nanoparticles, and wherein said nanoparticles consist essentially of a quaternary compound made of Cu, Zn, and Sn sulphide(s) with sizes of less than 500 nm, on a molybdenum layer of the substrate having a thin layer of molybdenum, and
   2) an annealing heat treatment of said layer deposited on said substrate is carried out, at a maximum temperature of at least 300° C., in order to obtain crystallization and growth of the nanoparticles in order to obtain large crystal grains of average sizes of at least 500 nm, over a thickness from 0.5 to 5 µm, with said crystal grains placed side-by-side in direct contact with each other,
   wherein said heat treatment comprises two successive annealing steps in the following different atmospheres, namely:
      a first annealing step in a neutral gas atmosphere, such as nitrogen or argon, and
      a second annealing step in a neutral gas atmosphere, such as nitrogen or argon containing $H_2S$.
2. The method according to claim 1, wherein the absorber material comprises the quaternary compound $Cu_2ZnSnS_4$.

3. The method according to claim 1, wherein the maximum temperature of the annealing heat treatment of step 2) is at least 450° C. in order to obtain a said layer of a thickness from 0.5 to 3 μm.

4. The method according to claim 1, wherein the second annealing step is carried out in a said neutral gas containing more than 0.1% in molar proportion of $H_2S$.

5. The method according to claim 1, wherein the maximum temperature for both first and second annealing steps is from 450 to 600° C., and the treatment duration at said maximum temperature is from 10 to 120 minutes.

6. The method according to claim 5, wherein said maximum temperature is from 500 to 520° C.

7. The method according to claim 1, wherein said dispersion of particles is an aqueous, alcoholic or hydro-alcoholic colloidal dispersion of primary amorphous nanoparticles with sizes from 2 to 100 nm.

8. The method according to claim 7, wherein the primary amorphous nanoparticles sizes are from 3 to 20 nm.

9. The method according to claim 7, wherein said colloidal dispersion is prepared by carrying out the following successive steps of:
   a) preparing a first aqueous, alcoholic, hydro-alcoholic solution of precursors of sulphides consisting of metal sulphide salt(s), other than copper, zinc, and tin salts, said metal sulphide salt being an alkaline or earth alkaline salt, and
   b) preparing a second solution of copper, zinc, and tin precursors, other than copper, zinc, and tin sulphides, in solution in a solvent comprising pure acetonitrile or mixed with water and/or an alcohol, said copper, zinc, and tin salt being a halide, and
   c) mixing both of said first and second solutions of precursors at atmospheric pressure and at room temperature until a crude colloidal dispersion is obtained, and
   d) separating the solid portion from said colloidal dispersion of step c), in order to obtain a precipitate of the solid after removing the liquid supernatant, and
   e) rinsing the solid precipitate obtained in step d) by pouring thereon an aqueous, acetonitrile, alcoholic or hydro-alcoholic solvent in order to re-form a colloidal dispersion, the alcohol of said alcoholic or hydro-alcoholic colloidal dispersion, and
   f) separating again the solid precipitate from said colloidal dispersion of step e), in order to obtain, after removing the liquid supernatant, a rinsed precipitate as a humid slurry.

10. The preparation method according to claim 9, wherein g), steps e) and f) for rinsing and separating the colloid, are repeated once or several times by centrifugation, and then re-dispersion in an aqueous, alcoholic or hydro-alcoholic solvent.

11. The preparation method according to claim 9, wherein:
   in step a), said first aqueous solution of NaSH is prepared, and
   in step b), said second solution containing $CuCl_2$, $ZnCl_2$, and $SnCl_4$ in acetonitrile mixed with water, is prepared in an acetonitrile/water volume ratio of at least 50/50, or in pure acetonitrile, and
   in step c), amorphous nanoparticles of Cu, Zn, and Sn sulphides, are obtained.

12. The method according to claim 7, wherein, in step 1), said colloidal aqueous dispersion is sprayed with a carrier gas consisting of an oxygen-free gas, which is a neutral gas, at atmospheric pressure, and a substrate temperature brought to at least 100° C., in order to form on a said substrate, a layer with a thickness from 0.5 to 15 μm before annealing.

13. The method according to claim 12, wherein said neutral gas is nitrogen.

14. The method according to claim 1, wherein, after the heat treatment step 2), a step for chemically cleaning said annealed thin layer is carried out by means of an acid solution, and said cleaned thin layer is then rinsed with water and dried.

15. The method according to claim 1, wherein said substrate is a substrate intended to be covered with an absorption layer of a semiconductor of type p in a solid photovoltaic device.

16. The method according to claim 15, wherein said substrate consists of a glass or steel layer covered with a rear contact layer, consisting of a molybdenum layer, useful in a solid photovoltaic device of the substrate type.

17. The method according to claim 1, wherein said absorber material is of a homogenous composition.

18. The method according to claim 17, wherein said absorber material layer is deposited on said substrate so that the covering rate of the surface of the substrate by the deposit of said layer is more than 95% and said layer has a porosity of less than 10%.

19. The method according to claim 17, wherein said absorber material layer contains no, or few, secondary crystalline phases of sulphides of only one or two metals selected from the group consisting of Cu, Zn, and Sn.

* * * * *